(12) United States Patent
Xie

(10) Patent No.: US 9,673,325 B2
(45) Date of Patent: Jun. 6, 2017

(54) FINFET DEVICE HAVING A MATERIAL FORMED ON REDUCED SOURCE/DRAIN REGION AND METHOD OF FORMING THE SAME

(71) Applicant: SEMICONDUCTOR MANUFACTURING INTERNATIONAL (SHANGHAI) CORPORATION, Shanghai (CN)

(72) Inventor: Xinyun Xie, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/842,773

(22) Filed: Sep. 1, 2015

(65) Prior Publication Data

US 2016/0093738 A1 Mar. 31, 2016

(30) Foreign Application Priority Data

Sep. 26, 2014 (CN) .......................... 2014 1 0500106

(51) Int. Cl.
| | | |
|---|---|---|
| *H01L 29/786* | (2006.01) | |
| *H01L 21/336* | (2006.01) | |
| *H01L 29/76* | (2006.01) | |
| *H01L 29/78* | (2006.01) | |
| *H01L 21/306* | (2006.01) | |
| *H01L 29/66* | (2006.01) | |

(Continued)

(52) U.S. Cl.
CPC .... *H01L 29/7848* (2013.01); *H01L 21/30604* (2013.01); *H01L 29/66795* (2013.01); *H01L 29/7851* (2013.01); *H01L 21/823814* (2013.01); *H01L 21/823821* (2013.01); *H01L 29/165* (2013.01)

(58) Field of Classification Search
CPC ............... H01L 29/165; H01L 29/7851; H01L 29/7848; H01L 21/02529; H01L 21/02378; H01L 29/1602; H01L 29/1608; H01L 33/34
See application file for complete search history.

(56) References Cited

U.S. PATENT DOCUMENTS

| | | | |
|---|---|---|---|
| 2007/0034972 A1* | 2/2007 | Chau ...................... | B82Y 10/00 257/401 |
| 2013/0214357 A1* | 8/2013 | Chang ............... | H01L 29/66545 257/347 |

(Continued)

*Primary Examiner* — Thomas L Dickey
*Assistant Examiner* — Damon Hillman
(74) *Attorney, Agent, or Firm* — Kilpatrick Townsend & Stockton LLP

(57) ABSTRACT

A semiconductor device includes a fin structure of a first semiconductor material on a substrate. The fin structure has a source region, a drain region, and a channel region between the source region and the drain region. The device also has a gate structure overlying the fin structure. The source region includes an inner portion of the first semiconductor material and an outer portion of a second semiconductor material overlying a top surface and side surfaces of the inner portion. The drain region includes an inner portion of the first semiconductor material and an outer portion of the second semiconductor material overlying a top surface and side surfaces of the inner portion.

14 Claims, 5 Drawing Sheets

(51) Int. Cl.
  *H01L 29/165* (2006.01)
  *H01L 21/8238* (2006.01)

(56) References Cited

U.S. PATENT DOCUMENTS

2014/0335673 A1* 11/2014 Kim .................. H01L 29/66545
                                                            438/283
2015/0311321 A1* 10/2015 Huang ................. H01L 29/785
                                                            438/157

* cited by examiner

FINFET DEVICE HAVING A MATERIAL FORMED ON REDUCED SOURCE/DRAIN REGION AND METHOD OF FORMING THE SAME

CROSS-REFERENCES TO RELATED APPLICATIONS

This application claims priority to Chinese patent application No. 201410500106.8, filed on Sep. 26, 2014, the content of which is incorporated herein by reference in its entirety.

BACKGROUND OF THE INVENTION

The present invention relates to the field of semiconductor technology. Specifically, embodiments of the invention are directed to transistor device structures and their manufacturing methods.

As semiconductor memory devices become increasingly integrated, the feature size including the channel length of individual devices is gradually reduced. This causes a short channel effect and also increases the junction leakage current. Leakage current was not a significant problem in the past, but it has become a more serious concern now that transistor gates and other chip components measure only a few atoms thick. In a notebook computer, leakage current means short battery life and in a server computer, it means higher power bills. Also, in a nonvolatile memory device, the leakage current leads to degradation of data retention time and other electrical characteristics as the device feature size is reduced.

Further, in small geometry devices, the threshold voltage is often difficult to control, and junction leakage current also becomes more difficult to control. Therefore, there is a need for an improved transistor device structure.

In a FinFET (Fin Field Effect Transistor), the conducting channel is built in a thin silicon "fin", which forms the body of the device. The wrap-around gate structure provides a better electrical control over the channel and thus, helps in reducing the leakage current and overcoming other short-channel effects.

In some conventional FinFET devices, the source/drain regions are formed by first removing the portions of the Fin structure that are not covered by the gate electrode, and then using epitaxial growth to form the source/drain regions that are attached to the channel regions.

BRIEF SUMMARY OF THE INVENTION

The inventors have identified several drawbacks in the conventional methods for forming source/drain regions in a FinFET device. For example, during the epitaxial growth process, there may be adhesion problems between the newly grown source/drain regions and the channel region. Further, during the epitaxial growth process, source/drain regions of adjacent devices may be merged or bridged. The conventional process may also degrade the quality of the epitaxially-grown semiconductor material, lead to release of stress, and cause anomalous leakage current, etc. Further, a prolonged epitaxial process may worsen the loading effect during film growth, causing non-uniform source/drain profiles. Embodiments of the present invention provide methods for forming the source and drain regions of a FinFET device that can alleviate the problems described above.

According to some embodiments of the present invention, a method for forming a semiconductor device includes forming a fin structure of a first semiconductor material on a substrate and forming a gate structure overlying the fin structure. The gate structure is configured to define a source region, a drain region, and a channel region in the fin structure. The channel region includes a first portion of the fin structure under the gate structure. The source region includes a second portion of the fin structure not under the gate structure. The drain region includes a third portion of the fin structure not under the gate structure. The channel region is disposed between the source region and the drain region. The method also includes removing a surface portion of the first semiconductor material from a top surface, a first and a second side surface, and an end surface of the source region and the drain region to form a reduced source region and a reduced drain region. Next, a layer of a second semiconductor material is formed on the top surface, the first and second side surfaces, and the end surface of the reduced source region and the reduced drain region.

In an embodiment of the above method, removing a surface portion of the first semiconductor material includes using an isotropic etching process, e.g., a wet etching process. In an embodiment, the first semiconductor material is a silicon material, and the wet etching process includes using a hydrofluoric acid (HF) based etching solution. In an embodiment, the wet etching process includes using a mixture of nitric acid and hydrofluoric acid. In some embodiments, the reduced source region has a width that is in a range of from one half to three quarters of the width of the source region of the fin structure. In some embodiments, the reduced source region has a width that is in a range of from one quarter to one half of the width of the source region of the fin structure. In some embodiments, forming a layer of a second semiconductor material comprises using an epitaxial growth process. In some embodiments, the first semiconductor material is a silicon material, and the second semiconductor material comprises a silicon germanium (SiGe) material. In some embodiments, the first semiconductor material is a silicon material, and the second semiconductor material comprises a silicon carbide (SiC) material. In some embodiments, the first semiconductor material is a silicon material, and the second semiconductor material comprises a silicon material. In some embodiments, forming a fin structure includes providing a substrate of a first semiconductor material, patterning and etching a surface portion of the substrate to form a fin structure, forming a dielectric layer and a gate material layer over the fin structure, and patterning and etching the dielectric layer and the gate material layer to form the gate structure.

According to some embodiments of the present invention, a semiconductor device includes a fin structure of a first semiconductor material on a substrate and a gate structure overlying and across the fin structure. A channel region includes a first portion of the fin structure under the gate structure. A source region includes a second portion of the fin structure not under the gate structure, and a cross-sectional area of the second portion is smaller than a cross-sectional area of the fin structure in the channel region. A drain region includes a third portion of the fin structure not under the gate structure, and a cross-sectional area of the third portion being smaller than the cross-sectional area of the fin structure in the channel region. In this device, the source region further includes a layer of a second semiconductor material overlying a top surface, a first and a second side surfaces, and an end surface of the second portion of the fin structure. The drain region further includes a layer of the second semiconductor material overlying a top surface, a first and a second side surfaces, and an end surface of the third portion of the fin structure.

Some embodiments of the above device have a raised source and drain. In other words, a top surface of the source region is higher than a top surface of the channel region, and a top surface of the drain region is higher than a top surface of the channel region. In some embodiments, the first semiconductor material comprises a silicon (Si) material, and the second semiconductor material comprises a silicon germanium (SiGe) material. In some embodiments, the first semiconductor material comprises a silicon (Si) material, and the second semiconductor material comprises a silicon carbide (SiC) material.

According to some alternative embodiments, a semiconductor device includes a fin structure of a first semiconductor material on a substrate. The fin structure has a source region, a drain region, and a channel region between the source region and the drain region. The device also has a gate structure overlying the fin structure. The source region includes an inner portion of the first semiconductor material and an outer portion of a second semiconductor material overlying a top surface and side surfaces of the inner portion. The drain region includes an inner portion of the first semiconductor material and an outer portion of the second semiconductor material overlying a top surface and side surfaces of the inner portion.

In some embodiments of the above device, a height of the outer portion of the source region is higher than a top surface of the channel region. In some embodiments, the first semiconductor material comprises a silicon (Si) material, and the second semiconductor material comprises a silicon germanium (SiGe) material. In some embodiments, the first semiconductor material comprises a silicon (Si) material, and the second semiconductor material comprises a silicon carbide (SiC) material.

The following description, together with the accompanying drawings, will provide further understanding of the nature and advantages of the claimed invention.

DETAILED DESCRIPTION OF THE INVENTION

Figure 1:
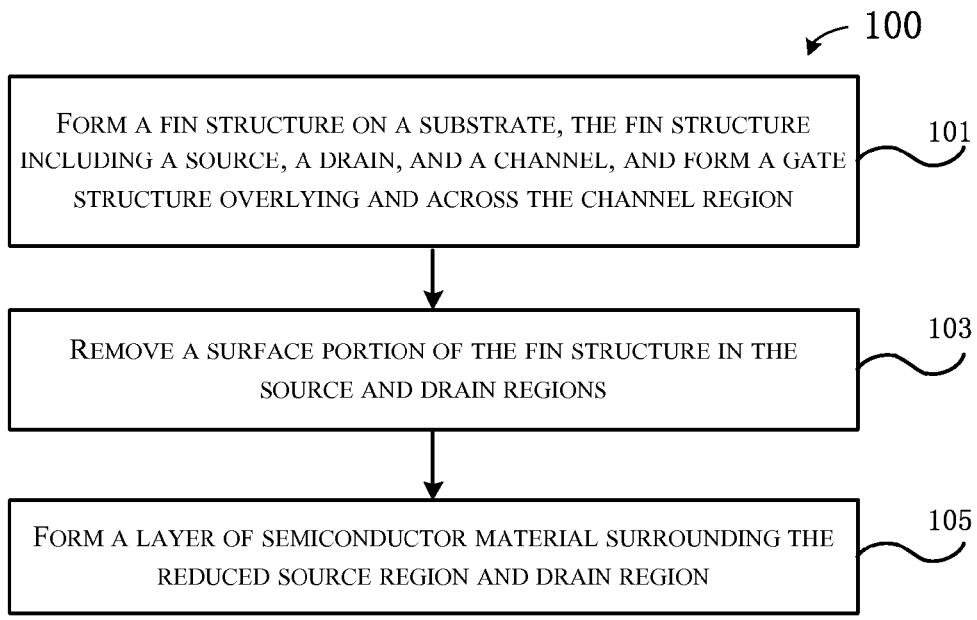
FIG. 1 is a simplified flow chart of a method for forming a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the sizes of the various components shown in the drawings are not necessarily drawn to actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further for the subsequent figures.

FIG. 1 is a simplified flow chart of a method for forming a semiconductor device according to an embodiment of the present invention. As shown in FIG. 1, method 100 can be summarized as follows:

Step 101: Form a fin structure on a substrate, the fin structure including a source, a drain, and a channel, and form a gate structure overlying and across the channel region;

Step 103: Remove a surface portion of the fin structure in the source and drain regions; and Step 105: Form a layer of semiconductor material surrounding the reduced source region and drain region.

Figure 2:
FIGS. 2-8 are perspective view diagrams illustrating the method for forming a semiconductor device according to embodiments of the present invention.
Figure 3:
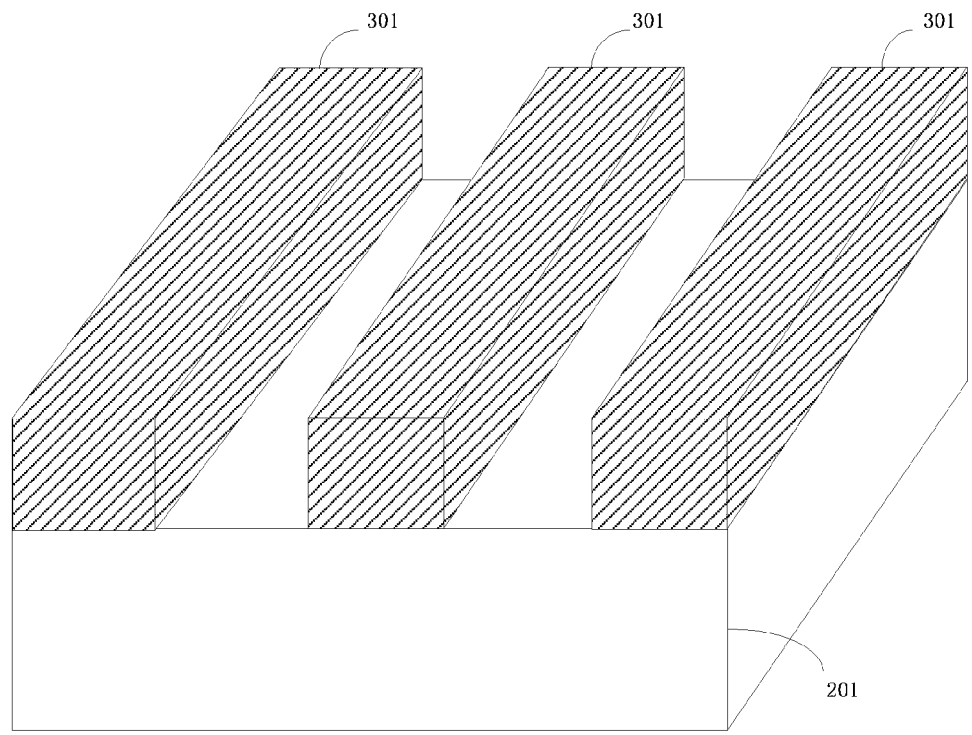
Figure 4:
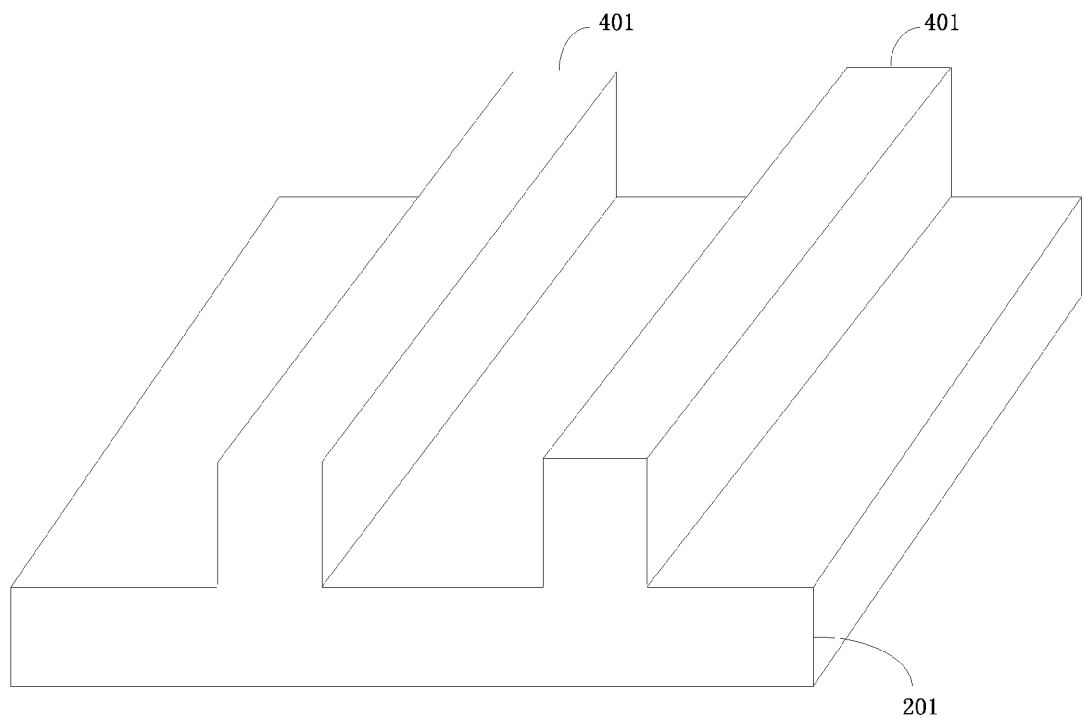

Method 100 is now explained with reference to perspective view diagrams in FIGS. 2-9. FIG. 2 shows a substrate 201, which can include doped regions and isolation regions. For example, substrate 201 can include a doped region for N-type metal oxide semiconductor (NMOS) devices, a doped region for a P-type metal oxide semiconductor (PMOS) device, and isolation regions such as shallow trench isolation (STI) regions. Next, as shown in FIG. 3, hard mask regions 301 are formed on substrate 201. The hard mask can be formed using different materials, such as silicon nitride, silicon oxide, nitrided silicon oxide, or silicon oxynitride, etc. The hard mask can also be formed with photoresist. In FIG. 4, substrate 201 is etched using hard mask 301 as the etch mask to form one or more fin structures 401. In FIG. 4, two fin structures 401 are shown as an example. However, it is understood that more than two fin structures can be formed. Further, besides the mask-etch process described above, the fin structures can also be formed using other methods, such as epitaxial growth, silicon-on-insulator (SOI) structures, etc.

Figure 5:
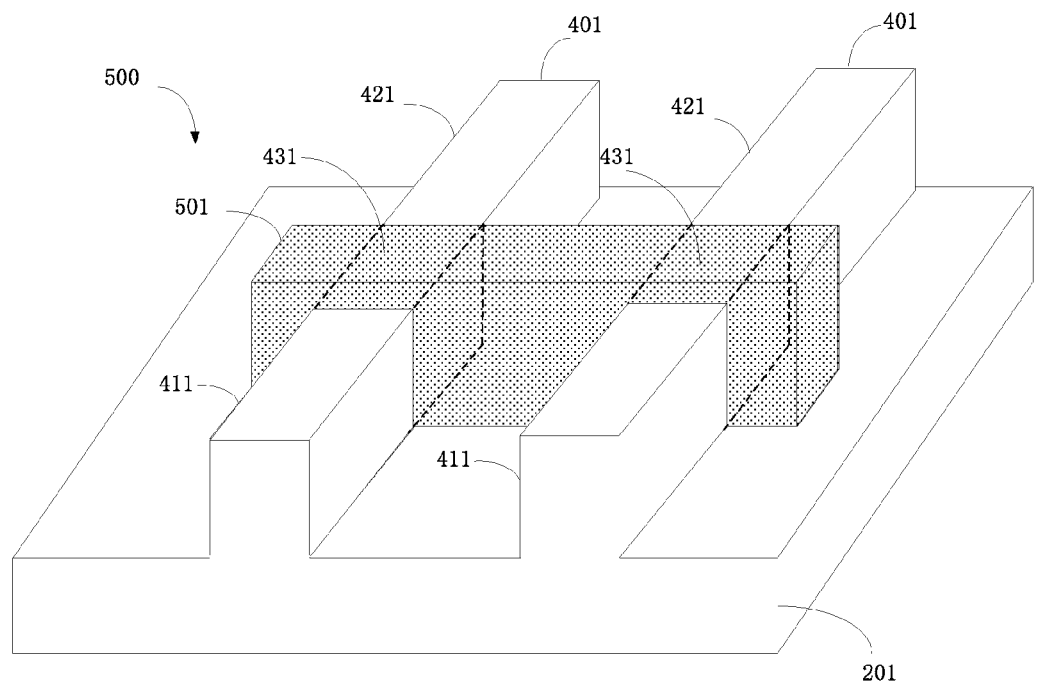

Next, as shown in FIG. 5, a gate structure 501 is formed overlying and across fin structures 401, to define source regions 411, drain regions 421, and channel regions 431. The device structure in FIG. 5 will be referred to as a substrate structure 500. Thus, substrate structure 500 includes a substrate 201, one or more fin structures 401, and a gate structure 501 that is disposed overlying fin structures 401. Note, in this example, the fin structures are formed by etching away portions of substrate 201 shown in FIG. 2. However, for convenience of illustration, in FIG. 5, substrate 201 also refers to the portion of the substrate under the fin structures. The reference should be clear from context. Further, the fin structures can also be made on a separate substrate, for example, using epitaxial growth to form the fins on a substrate, or using SOI methods to form the fins on a dielectric which overlies a substrate. As is shown in FIG. 5, channel region 431 is the portion of fin structure 401 that is covered by gate structure 501. Similarly, source region 411 and drain region 421 are located in portions of fin structure 401 on both sides of channel region 431 that are not covered by gate structure 501. As used herein, the description of gate structure 501 being "across" the channel region of the fin structure 431 refers to the gate structure covering the top surface and side surfaces of the channel region of fin structure 431 and the gate structure also covering portions of the surface of substrate 201 on both sides of the fin structure. It will also be understood that the positions of source region 411 and drain region 421 shown in FIG. 5 may be interchanged.

As described above, a method for forming the gate structure may include: depositing a dielectric material on the fin structure formed on the substrate, forming gate material on the dielectric material, patterning the gate material and the dielectric material to form a gate structure. Here, the formed gate structure may include one or more materials. For example, the gate structure may include a gate and a gate dielectric layer. The gate material may include polysilicon, metal, or metal stack. The gate dielectric may include silicon oxide, silicon nitride, high-K dielectric material (e.g., hafnium oxide), or a combination of these materials. In some other embodiments, the gate structure may also include spacers on both sides of the gate structures. The material for the sidewall spacer may include, for example, silicon nitride, silicon oxide, silicon oxynitride, and the like. Further, dopants may be implanted into the source and drain regions to form lightly-doped drain (LDD) regions, which can be activated by an annealing process.

Figure 6:
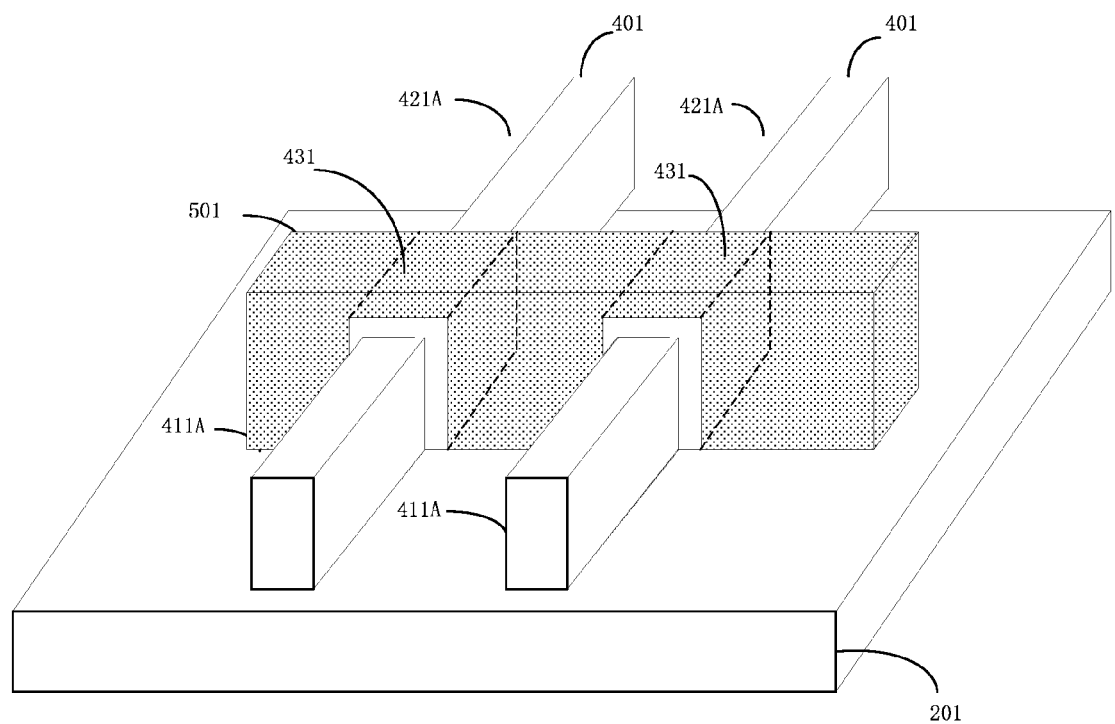

In FIG. 6, a portion of the top surface and side surfaces of the fin structure in the source and drain regions are removed, for example, using a wet etching process, in accordance with one embodiment of the invention. As an example, the source and drain regions of the fin structure can be etched isotropically in a wet etching, for example by HF based etching solution (e.g., a mixture of nitric acid and hydrofluoric acid) isotropic etching. Source region 411 and drain region 421 include a top surface substantially parallel to the substrate upper surface, and three side surfaces substantially perpendicular to the substrate surface. Therefore, an outer portion is removed from all these surfaces, forming a reduced source region 411A and a reduced drain region 421A. Note that in the above etch process, the gate structure can be protected with a mask layer. Alternatively, selective etching can be used with appropriate etch solutions to protect the gate structure. In some embodiments, the gate structure can be etched at the same time as the source and drain regions, while retaining the advantages of this method.

In FIG. 6, the amount of fin material removed can be selected for optimized device performance. In some embodiments, after etching, the reduced source region can have a width that can vary from $1/10$ to $9/10$ of the width of the source region of the fin. In an embodiment, the reduced source region can have a width that can vary from one half to three quarters of the width of the source region of the fin. In an embodiment, the reduced source region can have a width that can vary from one quarter to one half of the width of the source region of the fin. Similar dimension ranges also apply to the reduced drain regions.

Figure 6A:
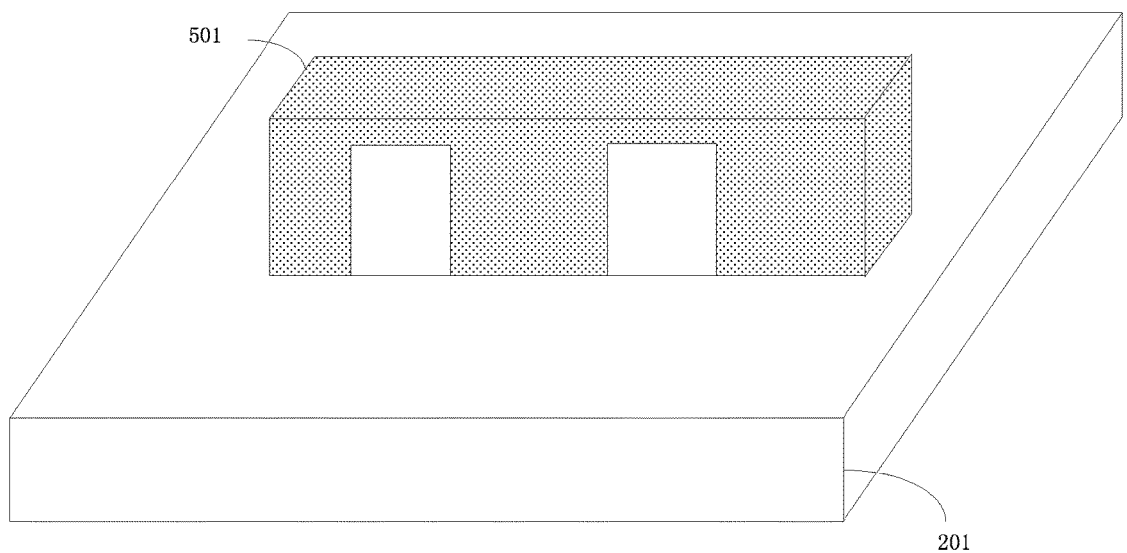

FIG. 6A illustrates a method of forming epitaxial source/drain regions according to a conventional method. Starting with the substrate structure 500 in FIG. 5 as described above, the conventional method substantially removes all the source regions and drain regions. An epitaxial process is then used to form source and drain regions. There are several drawbacks in the conventional methods for forming source/drain regions in an FinFET device, in which the whole source and drain regions are regrown in the epitaxial process. For example, there may be adhesion problems between the newly grown source/drain and the channel region. Further, during the epitaxial growth process, source/drain regions of adjacent devices may be merged or bridged. The process may degrade the quality of the epitaxially-grown semiconductor material, lead to release of stress, and cause anomalous leakage current, etc. Further, a prolonged epitaxial process may worsen loading effect, causing non-uniform source/drain profiles.

In contrast, in embodiments of the invention, such as the structure shown in FIG. 6, inner portions of the source and drain regions are retained, and only surface portions of the source region and the drain region are removed. The amount of material to be removed can be determined based on device requirements. As a result, less time and material are needed in the epitaxial growth for the source and drain regions, which can lessen the loading effect. The adhesion and bridging problems can be reduced, and the quality of the device can be improved.

Figure 7:
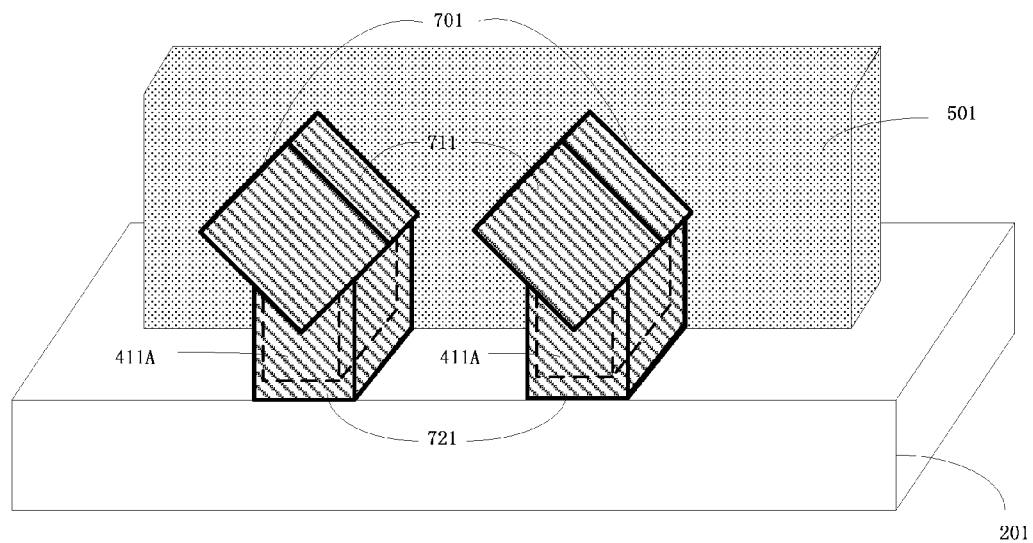
Figure 8:
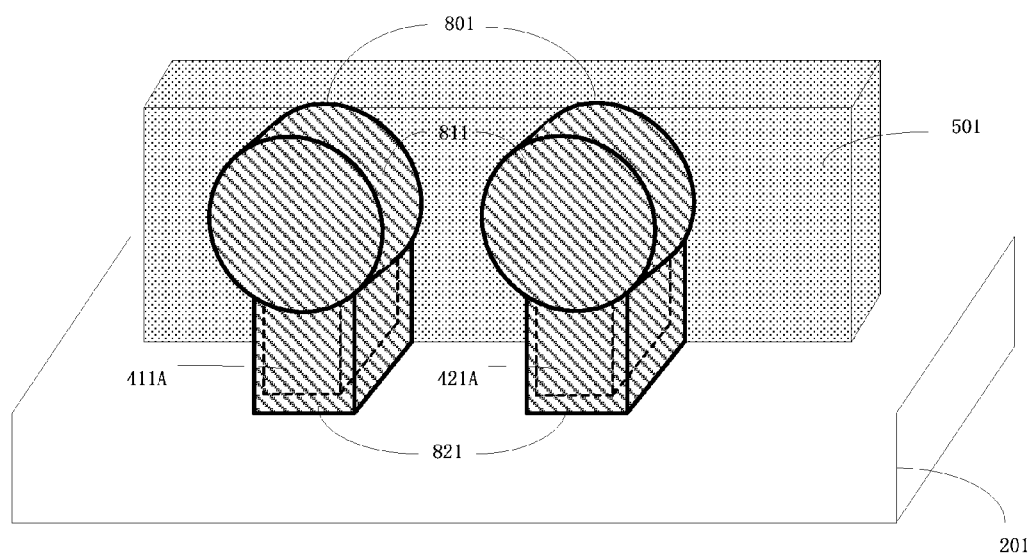

FIG. 7 illustrates a perspective view of fin structures in a PMOS region after the partial etch of source/drain regions and epitaxial regrowth of the source/drain regions. In an embodiment, the NMOS region may be masked by a mask or barrier layer (not shown), and the source region of the PMOS region is etched to remove surface portions to form reduced source region 411A. Then, a silicon germanium (SiGe) layer 701 is epitaxially grown on the reduced source/drain regions. As shown in FIG. 7, the epitaxial growth of SiGe 701 includes an epitaxial portion 711 on the top surface of the source region 411A and an epitaxial portion 721 on the side surfaces on the source region. Thus, the epitaxial growth of SiGe 701 completely surrounds the reduced source region 411A. FIG. 8 only shows source regions 411A, but the above explanation applies to the drain regions as well.

FIG. 8 illustrates a perspective view of fin structures in an NMOS region after the partial etch of source/drain regions and epitaxial regrowth of the source/drain regions. In an embodiment, the PMOS region may be masked by a barrier layer (not shown), and the source region of the NMOS region is etched to remove surface portions to form reduced source region 411A. Then, a silicon (Si) or silicon carbide (SiC) layer 801 is epitaxially grown on the reduced source/drain regions. As shown in FIG. 8, the epitaxial growth of Si or SiC layer 801 includes an epitaxial portion 811 on the top surface of the source region 411A and an epitaxial portion 821 on the side surfaces on the source region. Thus, the epitaxial growth of Si or SiC 801 completely surrounds the reduced source region 411A. FIG. 8 only shows source regions 411A, but the above explanation applies to the drain regions as well.

It should be noted that the hatch areas in FIGS. 7 and 8 are intended as examples to illustrate different epitaxially grown semiconductor materials, and are not intended to represent realistic profiles of the structures or to limit the scope of the disclosure. Further, the embodiments shown in FIGS. 7 and 8 may be combined, i.e., when both the NMOS region and the PMOS region can be present in the substrate, the NMOS region can be masked off with a protective mask, and epitaxial growth of SiGe can be carried out in the reduced source/drain regions of the PMOS region. Then, the PMOS region can be masked off with a protective mask, and epitaxial growth of Si or SiC can be carried out in the reduced source/drain regions of the NMOS region. Of course, the order of the process can be reversed for the PMOS and NMOS regions.

In some embodiments, it is possible to control the amount of semiconductor material epitaxially-grown. For example, by controlling the time of epitaxial growth of Si or SiGe, the top of the epitaxially-grown semiconductor material can be higher than the top of the channel region covered by the gate structure. In other words, raised source/drain regions can be formed. Since only the surface regions of the source/drain are removed, the time and material needed for the formation of the epitaxial growth source/drain region can be reduced. Bridging and adhesion problems can be reduced. In addition, micro loading effect can also be reduced because less epitaxial growth is needed.

Further, in-situ doping can be performed in the above-described step epitaxial growth. For example, epitaxially-grown Si can be doped with phosphorus (P), thereby forming a Si-P epitaxial layer. In another embodiment, the doping can be carried by ion implantation after the epitaxial growth of the semiconductor material. In some embodiments, conventional processes can be used to form backend device structures, such as contacts and interconnects.

According to some embodiments of the present invention, a semiconductor device includes a fin structure of a first semiconductor material on a substrate and a gate structure overlying and across the fin structure. A channel region includes a first portion of the fin structure under the gate structure. A source region includes a second portion of the fin structure not under the gate structure, the cross-sectional area of the second portion being smaller than a cross-sectional area of the fin structure in the channel region. A drain region includes a third portion of the fin structure not under the gate structure, the cross-sectional area of the third portion being smaller than the cross-sectional area of the fin structure in the channel region. In this device, the source region further includes a layer of a second semiconductor material overlying a top surface, a first and a second side surfaces, and an end surface of the second portion of the fin structure. The drain region further includes a layer of the second semiconductor material overlying a top surface, a first and a second side surfaces, and an end surface of the third portion of the fin structure.

According to some alternative embodiments, a semiconductor device includes a fin structure of a first semiconductor material on a substrate. The fin structure has a source region, a drain region, and a channel region between the source region and the drain region. The device also has a gate structure overlying the fin structure. The source region includes an inner portion of the first semiconductor material and an outer portion of a second semiconductor material overlying a top surface and side surfaces of the inner portion. The drain region includes an inner portion of the first semiconductor material and an outer portion of the second semiconductor material overlying a top surface and side surfaces of the inner portion.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method for forming a semiconductor device, comprising:

forming a fin structure of a first semiconductor material on a substrate, the fin structure comprising a source region, a drain region, and a channel region between the source and drain regions, the source and drain regions each having a first height, a first width, and a first length;

forming a gate structure overlying the channel region;

removing an outer portion of the first semiconductor material from a top surface, from first and second side surfaces opposite to each other, and from an end surface of the source region or the drain region to form a reduced source region or a reduced drain region having a second height smaller than the first height, a second width smaller than the first width, and a second length smaller than the first length; and forming a layer of a second semiconductor material on the top surface, the first and second side surfaces, and the end surface of the reduced source region or the reduced drain region.

2. The method of claim 1, wherein removing a surface portion of the first semiconductor material comprises using a wet etching process.

3. The method of claim 2, wherein the first semiconductor material is a silicon material, and the wet etching process comprises using a hydrofluoric acid (HF) based etching solution.

4. The method of claim 2, wherein the wet etching process comprises using a mixture of nitric acid and hydrofluoric acid.

5. The method of claim 1, wherein the second width of the reduced source region is in a range of from one half to three quarters of the width of the source region of the fin structure.

6. The method of claim 1, wherein the second width of the reduced source region is in a range of from one quarter to one half of the width of the source region of the fin structure.

7. The method of claim 1, wherein forming a layer of a second semiconductor material comprises using an epitaxial growth process.

8. The method of claim 1, wherein the first semiconductor material is a silicon material, and the second semiconductor material comprises a silicon germanium (SiGe) material.

9. The method of claim 1, wherein the first semiconductor material is a silicon material, and the second semiconductor material comprises a silicon carbide (SiC) material.

10. The method of claim 1, wherein the first semiconductor material is a silicon material, and the second semiconductor material comprises a silicon material.

11. The method of claim 1, wherein forming a fin structure comprises:

providing a substrate of a first semiconductor material; and patterning and etching a surface portion of the substrate to form a fin structure.

12. The method of claim 11, wherein forming a gate structure comprises:

forming a dielectric layer and a gate material layer over the fin structure; and patterning and etching the dielectric layer and the gate material layer to form the gate structure.

13. The method of claim 1, wherein the layer of the second semiconductor material has a top surface higher than a top surface of the channel region.

14. The method of claim 1, wherein the layer of the second semiconductor material completely surrounds the reduced source region or the reduced drain region.

* * * * *